June 20, 1950 C. BUTT 2,512,138
SHIELDING ARRANGEMENT
Filed June 1, 1945
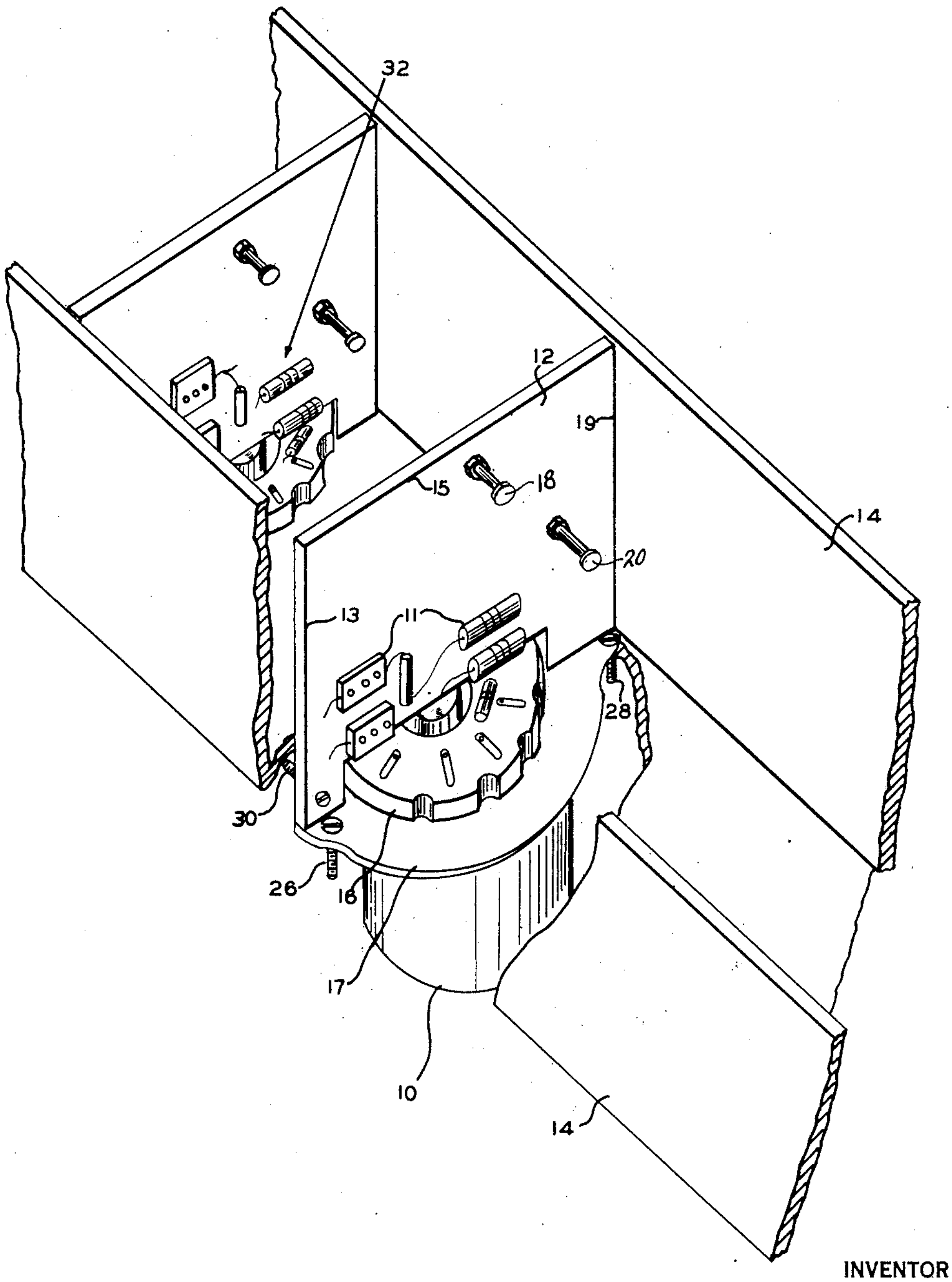
INVENTOR
CHARLES BUTT
BY William D. Hall
ATTORNEY Patented June 20, 1950

2,512,138

UNITED STATES PATENT OFFICE 2,512,138

SHIELDING ARRANGEMENT

Charles Butt, Waban, Mass., assignor, by mesne assignments, to the United States of America as represented by the Secretary of War Application June 1, 1945, Serial No. 597,033

1 Claim. (Cl. 179—171)

This invention relates generally to electrical circuits and more particularly to circuits involving electronic amplifiers.

In many electronic amplifiers, and particularly in those amplifiers having high gain and operating at high frequencies, the problem of undesirable feedback is of considerable importance. Feedback may be either interstage, that is, from one amplifier stage to another, or intrastage, that is, between circuit elements of a given stage. This feedback may occur as a result of currents induced in the chassis on which the amplifier is mounted, or it may be due to stray capacitive or inductive coupling between elements.

Many attempts have been made to minimize undesirable feedback by employing shielding, either of individual circuit elements or of complete amplifier stages. A disadvantage of many previous methods of shielding is that it adds to the bulk of the equipment upon which it is installed. Another disadvantage is that it tends to make repair difficult by rendering certain circuit elements inaccessible.

It is accordingly an object of this invention to provide an effective method of shielding which will successfully eliminate undesirable feedback which is caused by coupling between circuit elements or by chassis currents. It is a further object of this invention to produce this shielding in such a manner that the individual circuit elements are rendered easily accessible for purposes of repair or replacement.

The invention generally contemplates mounting all the circuit elements of a given amplifier stage on a single conducting plate or baffle in such a way that proper shielding is provided, and at the same time the amplifier stage is caused to be an integrated unit.

Other objects, features, and advantages of this invention will suggest themselves to those skilled in the art and will become apparent from the following description of the invention taken in connection with the accompanying drawing, which shows a perspective view of the invention mounted as a part of an electronic system.

Reference is now made to the drawing, which shows a portion of a multi-stage amplifier, which may be an IF or RF amplifier. One complete amplifier stage is shown, which includes a vacuum tube 10 and various other circuit elements 11 mounted on a baffle plate 12. These elements may include resistors, capacitors, and inductances. Those comprising the input circuit may be mounted on one side of baffle plate 12, and those making up the output circuit, on the other side. Plate 12 of an electrically conducting material is arranged to be perpendicular to the chassis 14 and is so shaped that it fits over vacuum tube socket 16 mounted on base 17. Plate 12 may be soldered to base 17 or attached to it by means of right angle brackets and bolts. In the preferred embodiment plate 12 should be of such size that a small space is left between it and the chassis 14 along edges 13, 15, and 19. Alternatively plate 12 may be arranged to make good electrical contact with the chassis along said edges, for example a soldered joint may be made. In addition to the other circuit elements, there are mounted on plate 12 lugs 18 and 20, electrically insulated from the plate, through which external connections may be made to the amplifier stage. It is obvious that as many other connecting lugs may be added as necessary. The entire stage is mounted on the chassis by means of bolts 26 and 28, which fasten base 17 to chassis 14, the latter having a circular aperture through which tube 10 passes. Bolt 30 is provided for a ground connection. Stage 32 is an adjacent stage similar to the one just described.

In operation, the baffle plate 12 provides effective shielding between the input and output of the amplifier stage and between the circuit elements of the amplifier stage and those of other stages. Feedback due to chassis currents is found to be almost entirely eliminated. The circuit elements are made easily accessible by permitting the removal of the entire stage as a unit. This removal may be effected by merely disconnecting lugs 18 and 20 and removing the lock nuts (not shown) from bolts 26 and 28.

It will be immediately obvious that the shape of the baffle plate 12 may be altered to fit the individual construction of the set in which the use of the invention is contemplated. It is also obvious that tube 10 and the other circuit elements may be rearranged so as to be adapted to any desired circuit arrangement.

It is also obvious that this invention need not be used exclusively with amplifier stages, but may be applied to other electronic circuits as well where shielding is desired.

Further advantages to be attributed to the invention include the following: Individual stages may easily be prefabricated in quantity and later assembled on a chassis in any required number. Defective stages may be easily removed and replaced. The stages may also be pretuned before assembly or may be removed when necessary, tuned with suitable apparatus, and returned to the chassis.

While there has been described what is at present considered to be the preferred embodiment of this invention, it will be obvious to those skilled in the art that various changes and modifications may be made therein without departing from the scope of the invention as set forth in the appended claim.

The invention claimed is:

An electronic device comprising a chassis including three conducting walls connected together to form three sides of a rectangle and having a plurality of openings in the middle one of said walls, a plurality of amplifier stages, each of said stages comprising a base mounted on said chassis and substantially covering one of the openings therein, a tube having input and output terminals and a socket mounted on said base, a single conducting plate mounted on said base substantially perpendicular to said chassis so that one edge of said plate is adjacent said tube and socket and between said input and output terminals and two other edges are slightly spaced from said chassis, input circuit components mounted on said plate on one side thereof, output circuit components mounted on said plate on the reverse side thereof, and a plurality of lugs mounted on said plate and insulated therefrom for making connections to said input and output circuit components, each complete stage being removable as a unit from said chassis.

CHARLES BUTT.

REFERENCES CITED

The following references are of record in the file of this patent:

UNITED STATES PATENTS

| Number | Name | Date |
|---|---|---|
| 1,747,938 | Hull | Feb. 18, 1930 |
| 2,111,381 | Barton | Mar. 15, 1938 |
| 2,111,397 | Holmes | Mar. 15, 1938 |
| 2,220,437 | Zottu | Nov. 5, 1940 |
| 2,221,105 | Otto | Nov. 12, 1940 |
| 2,248,787 | Schrumpf | July 8, 1941 |

FOREIGN PATENTS

| Number | Country | Date |
|---|---|---|
| 355,180 | Great Britain | Aug. 20, 1931 |
| 523,440 | Great Britain | July 15, 1940 |